(12) United States Patent
Amano et al.

(10) Patent No.: US 10,863,661 B2
(45) Date of Patent: Dec. 8, 2020

(54) SUBSTRATE WORKING DEVICE AND IMAGE PROCESSING METHOD

(71) Applicant: FUJI CORPORATION, Chiryu (JP)

(72) Inventors: Masafumi Amano, Okazaki (JP); Yuki Inaura, Chiryu (JP); Mikiya Suzuki, Nishio (JP); Shuichiro Kito, Toyota (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/485,853

(22) PCT Filed: Feb. 23, 2017

(86) PCT No.: PCT/JP2017/006938
§ 371 (c)(1),
(2) Date: Aug. 14, 2019

(87) PCT Pub. No.: WO2018/154691
PCT Pub. Date: Aug. 30, 2018

(65) Prior Publication Data
US 2020/0060052 A1 Feb. 20, 2020

(51) Int. Cl.
*H05K 13/08* (2006.01)
*G06K 9/32* (2006.01)
*G06T 3/40* (2006.01)

(52) U.S. Cl.
CPC ....... *H05K 13/0815* (2018.08); *G06K 9/3233* (2013.01); *G06T 3/4053* (2013.01); *H05K 13/0818* (2018.08)

(58) Field of Classification Search
None
See application file for complete search history.

(56) References Cited

U.S. PATENT DOCUMENTS

2006/0050267 A1* 3/2006 Murakami ............ G06T 7/0008
356/237.2
2017/0069057 A1* 3/2017 Kotani ............... H04N 1/19594

FOREIGN PATENT DOCUMENTS

| CN | 1746667 A | 3/2005 |
|---|---|---|
| JP | 2006-99758 A | 4/2006 |

(Continued)

OTHER PUBLICATIONS

International Search Report dated May 30, 2017 in PCT/JP2017/006938 filed on Feb. 23, 2017.

(Continued)

*Primary Examiner* — Christopher Braniff
(74) *Attorney, Agent, or Firm* — Oblon, McClelland, Maier & Neustadt, L.L.P.

(57) ABSTRACT

A substrate working device including: an imaging device configured to image a substrate; a memory device configured to memorize various information; and an image processing device configured to perform, when specified work is performed with respect to multiple substrates, for a leading substrate, leading-substrate processing of performing imaging processing for detecting a specified detection target required for the specified work with respect to a leading image obtained by imaging the leading substrate using the imaging device, acquiring region information related to a region in the leading image in which the detection target was detected, and memorizing the region information in the memory device, and, for subsequent substrates except for the leading substrate, subsequent-substrate processing of setting a partial processing region in a subsequent image of the subsequent substrate captured by the imaging device based on the region information, and performing the image processing with respect to the set processing region.

6 Claims, 6 Drawing Sheets

(56) References Cited

FOREIGN PATENT DOCUMENTS

| | | |
|---|---|---|
| JP | 2008-159890 A | 7/2008 |
| JP | 2013-62378 A | 4/2013 |
| JP | 2014-207350 A | 10/2014 |
| WO | WO2015/049723 A1 | 4/2015 |
| WO | WO2015/136669 A1 | 9/2015 |

OTHER PUBLICATIONS

Chinese Office Action issued in Chinese Patent Application No. 201780036364.3 dated Jun. 22, 2020 (w/ English translation).

* cited by examiner

SUBSTRATE WORKING DEVICE AND IMAGE PROCESSING METHOD

TECHNICAL FIELD

This specification discloses a substrate working device and an image processing method.

BACKGROUND ART

Conventionally, there has been proposed a substrate working device for performing work on a substrate such as mounting a component, which performs super-resolution processing for generating a high-resolution image, having a resolution higher than that of an image obtained by imaging a component, in order to obtain the position, angle, and the like of a held component with high accuracy (for example, refer to patent literature 1). In such a substrate working device, a high-resolution image is generated by performing super-resolution processing only on a processing region including a characteristic portion of a component.

CITATION LIST

Patent Literature

Patent literature 1: WO2015/049723

SUMMARY

However, in recent years, target objects of super-resolution processing have tended to become tiny along with the miniaturization of substrates and components, and in some cases, the target object cannot be recognized unless a high-resolution image generated by the super-resolution processing is used. In this case, it is difficult to specify a processing region including a characteristic portion of a target object such as a component before super-resolution processing, and image processing such as super-resolution processing is performed with the entire region of the image as a processing region. In this case, the processing time of the image processing is longer than necessary, and the efficiency of the image processing is lowered.

It is a main object of the present disclosure to efficiently perform image processing necessary for work on a substrate.

The present disclosure employs the following means to achieve the above object.

A substrate working device of the present disclosure includes: an imaging device configured to image a substrate; a memory device configured to memorize various information; and an image processing device configured to perform, for a leading substrate among multiple of the substrates that are a target for specified work, leading-substrate processing of performing imaging processing for detecting a specified detection target required for the specified work with respect to a leading image obtained by imaging the leading substrate using the imaging device, acquiring region information related to a region in the leading image in which the detection target was detected, and memorizing the region information in the memory device, and, for subsequent substrates among the multiple of the substrates that are the target for specified work except for the leading substrate, subsequent-substrate processing of setting a partial processing region in a subsequent image of the subsequent substrate captured by the imaging device based on the region information memorized in the memory device, and performing the image processing with respect to the set processing region.

A substrate working device of the present disclosure performs leading-substrate processing of, for a leading substrate among multiple of the substrates, performing imaging processing for detecting a specified detection target required for the specified work with respect to a leading image obtained by imaging the leading substrate, acquiring region information related to a region in the leading image in which the detection target was detected, and memorizing the region information. A substrate working device of the present disclosure also performs, for subsequent substrates among the multiple of the substrates except for the leading substrate, subsequent-substrate processing of setting a partial processing region in a subsequent image of the subsequent substrate captured by the imaging device based on the region information memorized in the leading-substrate processing, and performing the image processing with respect to the set processing region. As a result, it is possible to appropriately set a partial processing region in the subsequent image based on the region information memorized in the leading-substrate processing. In the subsequent-substrate processing, image processing may be performed on a partial processing region without using all of the subsequent image as a processing region, such that image processing required for work on multiple substrates can be efficiently performed.

An image processing method of the present disclosure is for processing an image of a substrate on which specified work is to be performed, the image processing method including: (a) a first image processing step for detecting a specified detection target required for the specified work in a leading image that is an image of a leading substrate among the multiple substrates that are the target for the specified work; (b) an acquiring step for acquiring region information related to a region inside the leading image in which the detection target was detected in the image processing step (a); (c) a setting step for setting a partial processing region based on the region information acquired in the acquiring step (b) for a subsequent image that is an image of a subsequent substrate that is a substrate other than the leading substrate among the multiple substrates that are the target for the specified work; and (d) a second image processing step for detecting a specified detection target required for the specified work in the processing region from the subsequent image set in the setting step (c).

With an image processing method of the present disclosure, similarly to the above-described a substrate working device, it is possible to appropriately set a partial processing region in the subsequent image based on the region information memorized in the leading-substrate processing. Further, in the subsequent-substrate processing, image processing may be performed on a partial processing region without using all of the subsequent image as a processing region, such that image processing required for work on multiple substrates can be efficiently performed. Note that, with this image processing method, various forms of the above substrate working device may be employed, and steps to perform each function of the above substrate working device may be added.

DESCRIPTION OF EMBODIMENTS

Figure 1:
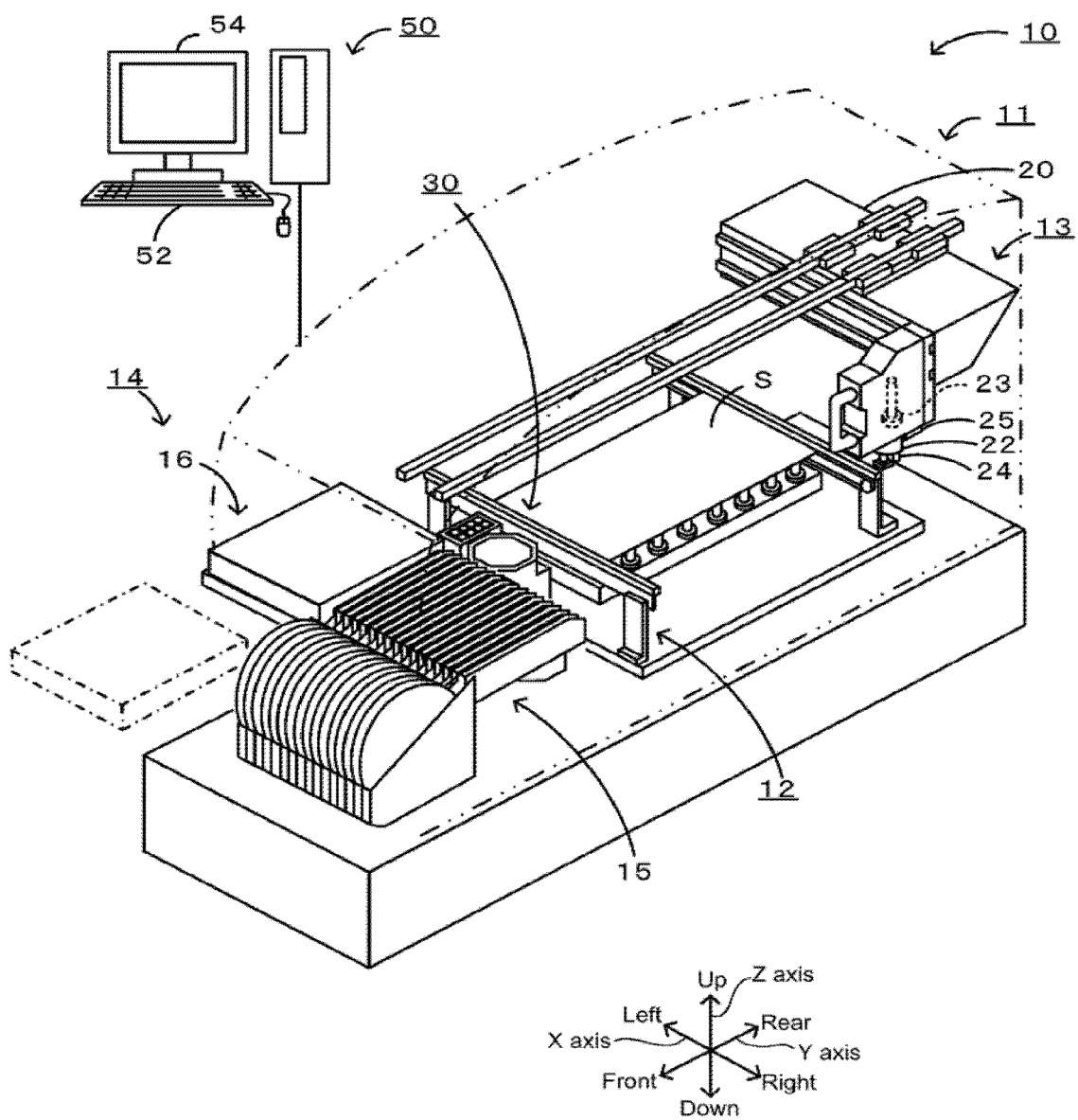
FIG. 1 shows the configuration of mounting system 10.
Figure 2:
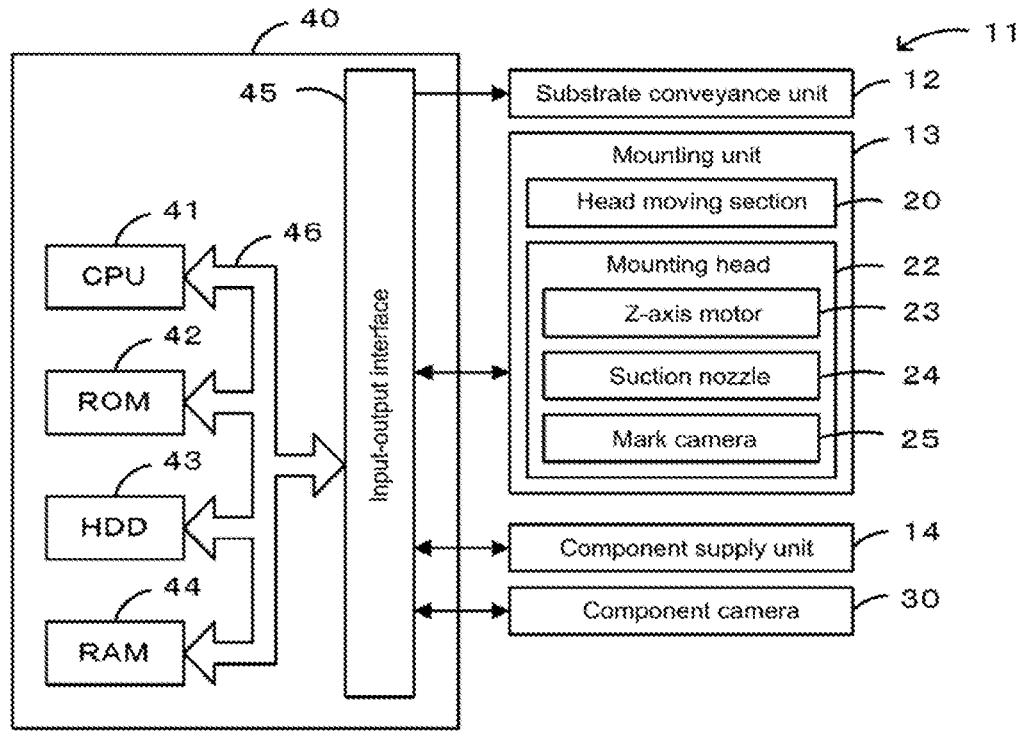
FIG. 2 is a block diagram showing the configuration of mounting device 11.

Embodiments of the present disclosure are described below using the figures. FIG. 1 shows the configuration of mounting system 10. FIG. 2 is a block diagram showing the configuration of mounting device 11. Mounting system 10, for example, mounts components on substrate S. Mounting system 10 includes mounting device 11 that performs mounting processing of mounting components on substrate S, and management computer (PC) 50 that manages each device of mounting system 10. In mounting system 10, multiple mounting devices 11 are arranged from upstream to downstream. For ease of understanding, FIG. 1 only shows one mounting device 11. Mounting processing includes processing such as arranging a component above a substrate, mounting, insertion, joining, and gluing. Also, in the present embodiment, left-right directions (X axis), front-rear directions (Y axis), and up-down directions (Z axis) are set as shown in FIG. 1.

As shown in FIGS. 1 and 2, mounting device 11 includes substrate conveyance unit 12, mounting unit 13, component supply unit 14, component camera 30, and control device 40. Substrate conveyance unit 12 loads substrate S, conveys substrate S, fixes substrate S at a mounting position, and unloads substrate S. Substrate conveyance unit 12 includes a pair of conveyor belts provided extending in a left-right direction and separated in the front-rear direction of FIG. 1. Board S is conveyed by these conveyor belts.

Mounting unit 13 picks up a component from component supply unit 14 and mounts the component on substrate S fixed by substrate conveyance unit 12. Mounting unit 13 includes head moving section 20 and mounting head 22. Head moving section 20 is provided with sliders that move in XY directions guided by guide rails and motors that drive the sliders. Mounting head 22 is removably attached to a slider and is movable in the XY directions by head moving section 20. At least one suction nozzle 24 is removably attached to an underside of mounting head 22. Suction nozzle 24 is a pickup member for picking up a component using negative pressure. Mounting head 22 is equipped with Z-axis motor 23 and the height of suction nozzle 24 is adjusted along the Z-axis by Z-axis motor 23. Also, mounting head 22 is provided with a rotation device that uses a drive motor, not shown, to rotate (on its own axis) suction nozzle 24, such that the angle of the component held (picked up) by suction nozzle 24 can be adjusted.

Mark camera 25 is arranged on the lower surface of mounting head 22 (or slider). Mark camera 25 moves in the XY directions with the movement of mounting head 22. Mark camera 25 images reference mark M on substrate S, images a component supplied by the component supply unit 14 from above, and outputs images to control device 40.

Component supply unit 14 is for supplying components from the front side of mounting device 11, and includes tape feeders 15 that are aligned in the horizontal direction (X direction) and are capable of supplying components by tape, and tray feeder 16 which is capable of supplying components by tray. Tape feeder 15 includes a reel on which a tape in which components are accommodated at predetermined intervals is wound, and the tape is pulled out from the reel to supply the components. Tray feeder 16 supplies components using trays in which the components are arranged.

Component camera 30 captures an image of a component held by suction nozzle 24 of mounting head 22 from below, and outputs the image to control device 40.

As shown in FIG. 2, control device 40 is configured from a microprocessor based around CPU 41, ROM 42 that memorizes a processing program, HDD 43 that memorizes various data, RAM 44 used as working memory, input-output interface 45 for performing communication of electric signals with external devices, and so on. These items are connected by bus 46. Control device 40 outputs control signals to substrate conveyance unit 12, mounting unit 13, component supply unit 14, and component camera 30, and receives signals from mounting unit 13 (mark camera 25), component supply unit 14, and component camera 30.

Management PC 50 manages information of each device of mounting system 10. Management PC 50 is provided with a control device configured from a microprocessor based around a CPU, and this control device is provided with ROM that memorizes a processing program, an HDD that memorizes various data, RAM used as working memory, an input-output interface for performing communication of electric signals with external devices, and so on. Management PC 50 is provided with input device 52 such as a keyboard and mouse for an operator to input various commands, and display 54 for displaying various information.

Figure 3:
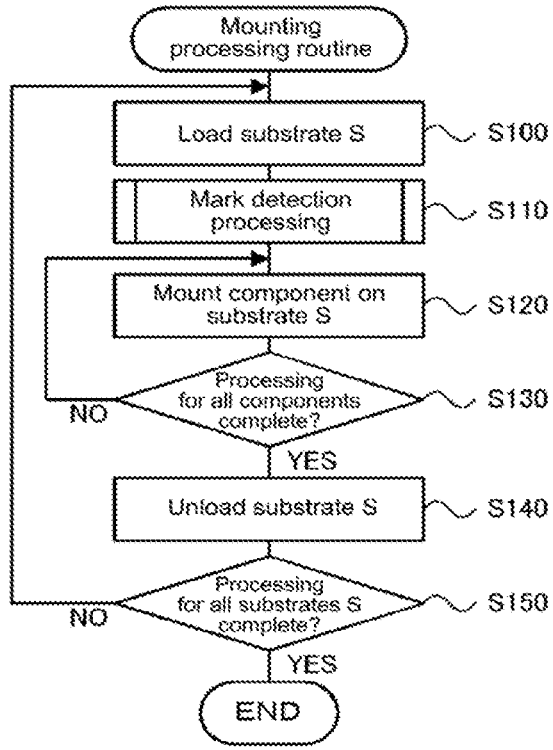
FIG. 3 is a flowchart showing an example of a mounting processing routine.

Next, operation of mounting system 10 of the present embodiment as configured above is described, specifically, mounting processing of mounting device 11. FIG. 3 is a flowchart showing an example of a mounting processing routine performed by CPU 41 of control device 40. This routine is memorized on HDD 43 of control device 40 and is performed based on a start command for mounting processing from an operator via input device 52 of management PC 50 or the like. Note that, mounting device 11 performs mounting processing on multiple substrates S of the same type.

Figure 4:
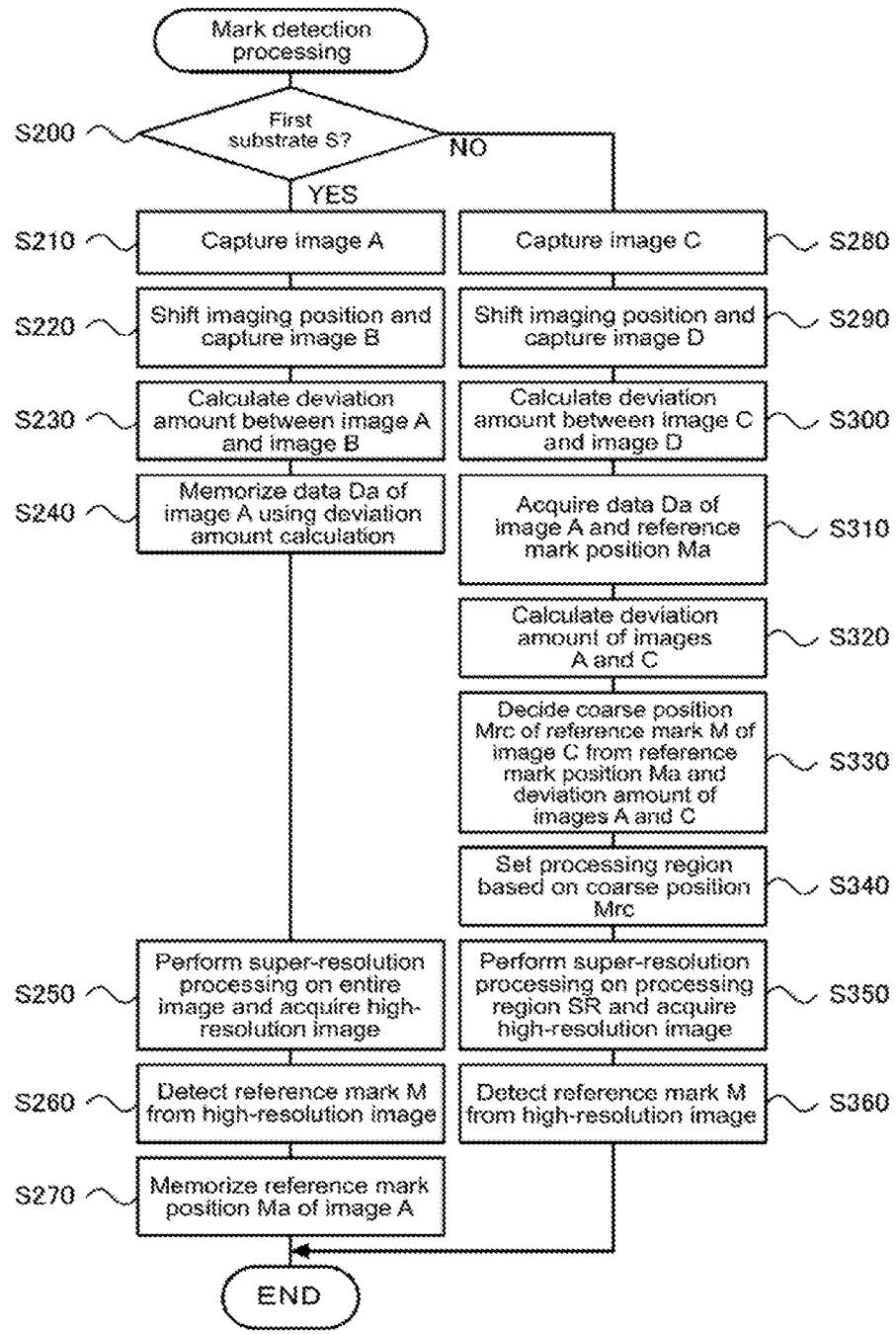
FIG. 4 is a flowchart illustrating an example of mark detection processing.
Figure 5:
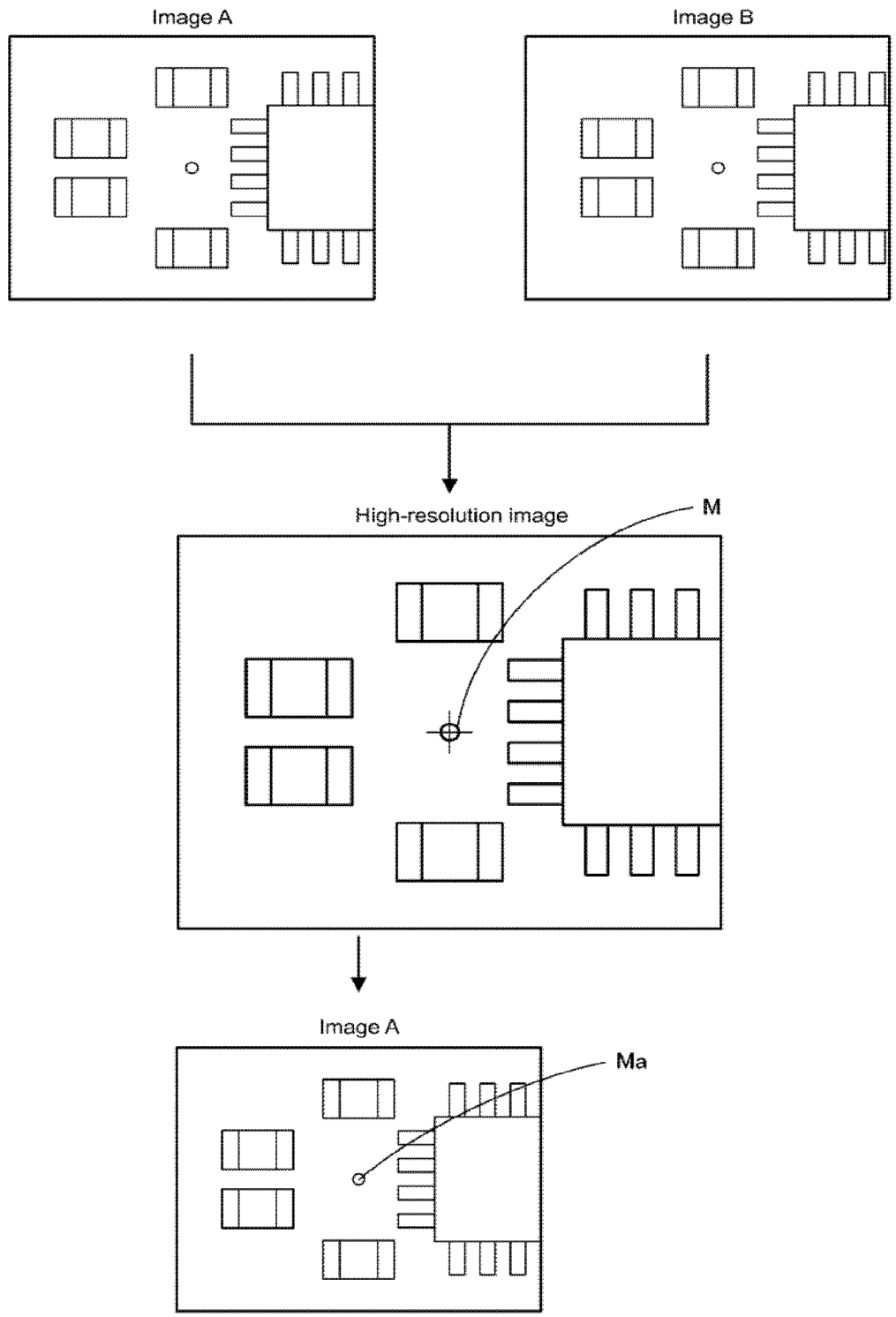
FIG. 5 illustrates image processing for the first substrate S.
Figure 6:
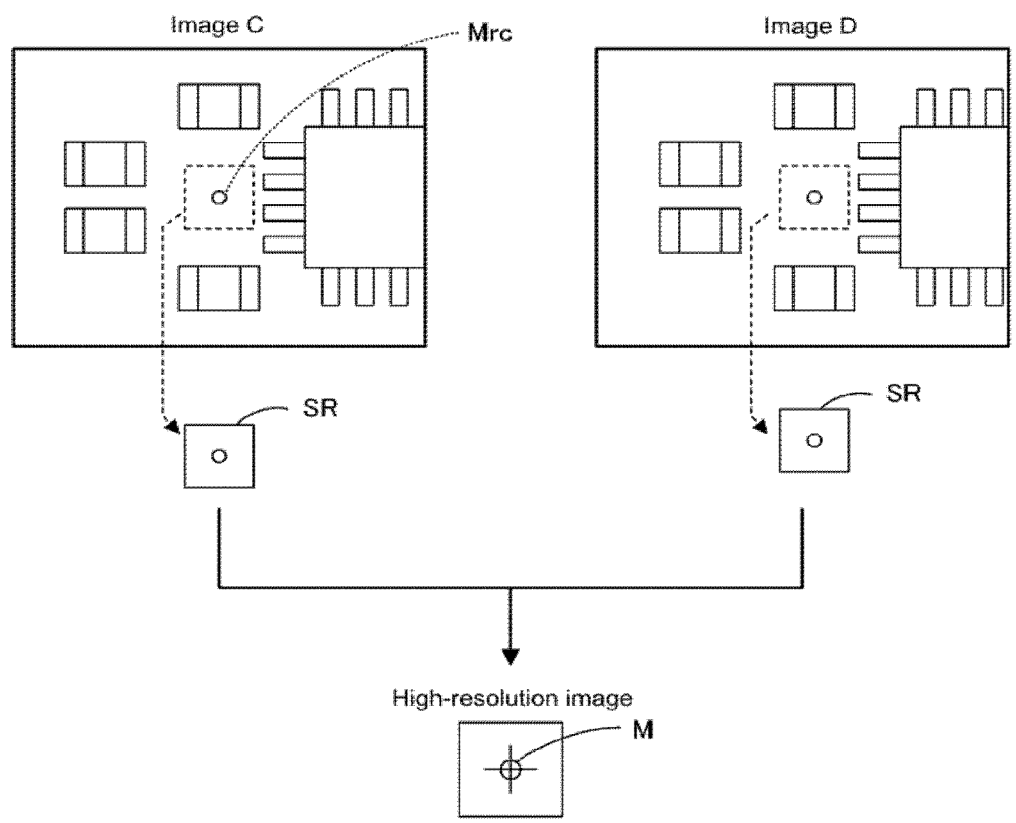
FIG. 6 illustrates image processing for the second substrate S and after.

When this routine is started, CPU 41 of control device 40 first loads substrate S using substrate conveyance unit 12 (S100), and performs mark detection processing (S110), which will be described later, for detecting reference marks M of substrate S. Then, the CPU 41 mounts the components held by suction nozzles 24 of mounting head 22 on the substrate S (S120). CPU 41 mounts the components on substrate S in S120 while correcting the mounting position of the component with reference to the position of the reference mark M detected in the S110 mark detecting process. CPU 41 repeats processing of S120 until it determines that the processing has been completed for all the components to be mounted on substrate S at present (S130). When it is determined that processing for all the components to be mounted on the current substrate S has been completed, CPU 41 unloads the substrate S using substrate conveyance unit 12 (S140), and determines whether mounting processing for all the substrates S has been completed (S150). If it is determined that the processing for all the substrates S has not been completed, CPU 41 returns to S100 and repeats the processing, and if it is determined that the processing for all the substrates S has been completed, the mounting processing routine is terminated. Mark detection processing of S110 is described below. As an example of the mark detection processing of S110, descriptions are given in a case of CPU 41 using multi-frame reconstruction type super-resolution processing. The multi-frame reconstruction type super-resolution processing is processing for acquiring an image having a higher resolution from multiple images. FIG. 4 is a flowchart showing an example of mark detection processing. FIG. 5 illustrates image processing for the first substrate S. FIG. 6 illustrates image processing for the second substrate S and after.

In the mark detection processing of FIG. 4, CPU 41 of control device 40 first determines whether the substrate S to be processed this time is the leading (first) substrate S among multiple substrates S of the same type (S200). If CPU 41 determines that the substrate S is the leading substrate S, mark camera 25 captures an image A (see FIG. 5) which is the first image of the leading substrate S (S210). Further, CPU 41 shifts the imaging position of the substrate S by mark camera 25 by slightly moving mounting head 22 using head moving section 20 of mounting unit 13, then captures an image B (see FIG. 5), which is the second image of the leading substrate S, using mark camera 25 (S220). The image capturing position of the image B may be, for example, a position shifted by 1/X pixels (1<X, e.g., X=2) with respect to the image A so that CPU 41 can execute the multiframe super-resolution processing. Note that, for ease of understanding, FIG. 5 shows an image B taken at an image pickup position shifted by more than 1/X pixel. Further, the positions of mark camera 25 and substrate S may be shifted relative to each other, and substrate S may be moved, or mark camera 25 (mounting head 22) may be moved. Next, CPU 41 performs image processing on images A and B to calculate the positional deviation between the images A and B (S230). For example, CPU 41 calculates the positional deviation amounts of the images A and B by using a known template matching method, a phase-limited correlation method, or the like. In the present embodiment, it is assumed that CPU 41 calculates the positional deviation using a phase-limited correlation method. The phase-limited correlation method is a known method in which an image to be processed (here, images A and B) is subjected to Fourier transform, and correlation is performed using only the phase component of the phase component and the amplitude component in the Fourier-transformed data. In addition, CPU 41 stores the Fourier-transformed data Da of image A used for calculating the positional deviation amount in the HDD 43 (S240).

Then, CPU 41 performs super-resolution processing on all regions of the images A and B based on the positional deviation amount of the images A and B to obtain a high-resolution image based on the image A (see S250 in FIG. 5). Subsequently, CPU 41 performs mark detection processing for detecting reference mark M by extracting regions in which colors (pixel values), shapes, numbers of pixels, and the like coincide with those of the reference mark M from the obtained high-resolution images (S260). In addition, CPU 41 calculates the reference mark position Ma in image A by reverse calculation from the position coordinates of reference mark M in the high-resolution image detected by S260, stores the reference mark position Ma in HDD 43 (S270, see FIG. 5), and ends the mark detection processing. For example, CPU 41 calculates the reference mark position Ma from the position coordinates of reference mark M by reverse calculating the distance corresponding to the number of N pixels in the high-resolution image with the distance corresponding to the number of N/X pixels in the image A. In this manner, CPU 41 captures two images, image A and image B, with respect to the leading (first) substrate S, performs the super-resolution processing on the entire area of these images to detect the position of the reference mark M. Further, CPU 41 stores the Fourier-transformed data Da of the first image A and the reference mark position Ma of the image A when the mark detection processing of the leading substrate S is performed. Note that, the processing of S210 to S270 corresponds to the leading-substrate processing.

When CPU 41 determines that the board S to be processed this time is not the leading substrate S, but a subsequent substrate S that is the second or after substrate S in S200, mark camera 25 captures image C (see FIG. 6) that is the first image of subsequent substrate S (S280). Further, CPU 41 shifts the imaging position of the substrate S by mark camera 25 by slightly moving mounting head 22 using head moving unit 20 of mounting unit 13, then captures image D (see FIG. 6) that is the second image of subsequent substrate S using mark camera 25 (S290). Next, CPU 41 performs image processing on images C and D to calculate the positional deviation between images C and D (S300). CPU 41 performs the processing of S280 to S300 similarly to the processing of S210 to S230.

Continuing, CPU 41 acquires, from HDD 43, Fourier-transformed data Da of image A and reference mark position Ma of image A that were memorized in S240 and S270 during the mark detection processing of image A of leading substrate S (S310). Then, CPU 41 calculates the positional deviation between first image A of leading substrate S and first image C of subsequent substrate S to be processed this time (S320). In the present embodiment, CPU 41 calculates the positional deviation amount of images A and C by a phase-limited correlation method using the Fourier-transformed data Da of image A acquired in S310 and the Fourier-transformed data of image C subjected to the Fourier transformation when calculating the positional deviation amount in S320. Here, images A and C are captured by imaging different substrates S, but since they are images of the same type of substrate S, wiring patterns, holes, and the like formed on the substrates S appear in the respective images in a similar manner. However, since the positional relationship between substrate S and mark camera 25 when capturing images A and C is not exactly the same, the positions of the wiring patterns and the holes appearing in the image are also shifted. CPU 41 can detect such deviations by means of phase components obtained from the Fourier-transformed data. Thus, in S320, CPU 41 calculates the positional deviation amount of images A and C based on the positional deviation of the wiring pattern and the holes. Then, CPU 41 determines coarse position Mrc, which is an approximate position of reference mark M in image C, from reference mark position Ma of image A acquired in S310 and the positional deviation amount of images A and C calculated in S320 (S330, see FIG. 6). In addition, CPU 41 sets the partial regions of images C and D to high-resolution processing region SR based on the coarse position Mrc determined in S330 (S340, see FIG. 6). Note that, processing region SR may be, for example, a region several times as large as the mark diameter of reference mark M, a region obtained by adding a predetermined margin to the mark diameter, or the like, with the coarse position Mrc as the center.

Figure 7A:
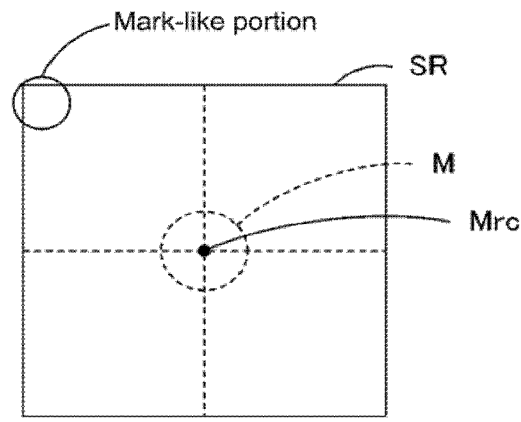
FIG. 7 illustrates adjustment of processing region SR.
Figure 7B:
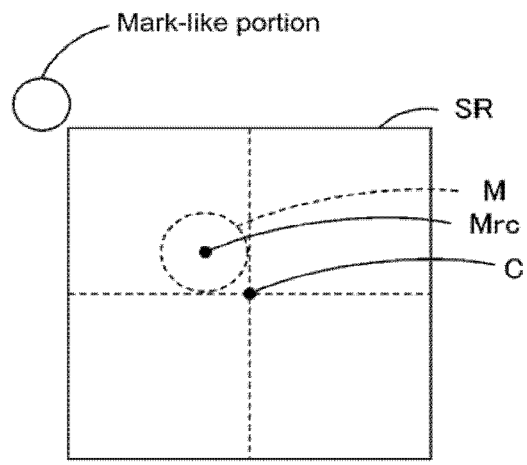
Figure 7C:
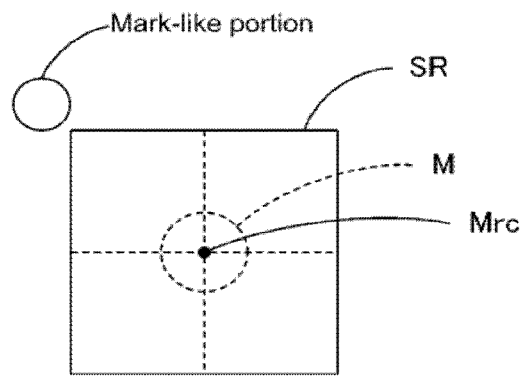

Here, an operator may be able to adjust processing region SR using, for example, management PC 50 or the like. Further, an operator may set a region offset with respect to coarse position Mrc as the processing region SR without setting the coarse position Mrc as the center, or may finely adjust the size of the region. FIG. 7 illustrates adjustment of processing region SR. FIG. 7A shows a rectangular processing region SR in which the vertical and horizontal lengths of the processing region SR are set to, for example, about four times the mark diameter D, with the coarse position Mrc as the center. FIG. 7B shows a rectangular processing region SR whose center position C is offset with respect to the coarse position Mrc. FIG. 7C shows a rectangular processing region SR in which the vertical and horizontal lengths of the processing area SR are respectively adjusted in size to, for example, about twice the mark diameter D, with the coarse position Mrc as the center. FIG. 7 shows a case in which a mark-type portion having a color or a shape similar to that of reference mark M, such as a component or solder, exists in the vicinity of reference mark M. In this case, in processing region SR of FIG. 7A, since the mark-like portion is included in processing region SR, there is a possibility that mark M will be erroneously detected. On the other hand, in the processing region SR in FIG. 7B or FIG. 7C, the mark-like portion is outside processing region SR. Therefore, when the mark-like portion is in the vicinity of the reference mark M, an operator can prevent erroneous detection of reference mark M by adjusting the processing region SR as shown in FIG. 7B or 7C.

When the processing region SR is set in this manner, CPU 41 performs super-resolution processing on the processing region SR of the respective images C and D based on the positional deviation amount of image C and the image D to obtain a high-resolution image based on the processing region SR of image C (S350). Continuing, CPU 41 performs mark detection processing on the obtained high-resolution images to detect reference mark M (S360), then ends the mark detection processing. Note that, the processing of S280 to S360 corresponds to subsequent-substrate processing. In this manner, CPU 41 performs super-resolution processing on processing area SR of the two images C and D with respect to the second and later substrates S to detect reference mark M. That is, since CPU 41 performs the super-resolution processing only on partial processing regions SRs, not the entire regions of the images, the processing load of the super-resolution processing is reduced and the mark detection processing is be performed quickly. In addition, since CPU 41 calculates the positional deviation amount of images A and C using the data Da after Fourier transformation of image A when performing the mark detection processing of leading substrate S, and sets processing region SR based on the coarse position Mrc determined using the calculated positional deviation amount and reference mark position Ma in image A, it is possible to set an appropriate region having a high possibility of including reference mark M as the processing region SR by a simple process. Therefore, super-resolution processing for detecting reference mark M is performed quickly. Thus, even if reference mark M on substrate S is extremely small, mounting device 11 can appropriately detect the reference mark M using the super-resolution processing without increasing the resolution of mark camera 25 itself.

Next, correspondences between constituent elements of the substrate working device of the present embodiment and constituent elements of the disclosure will be clarified. Mark camera 25 of the present embodiment corresponds to an imaging device; HDD 43 corresponds to a memory device; control device 40 corresponds to an image processing device; and mounting device 11 corresponds to a substrate working device. Note that, in the present embodiment, an example of an image processing method of the present disclosure is also clear from the description of operation of mounting device 11.

When the mounting operation is performed on multiple substrates S of the same type, mounting device 11 of an embodiment described above, with respect to the leading substrate S that is the first substrate, performs leading-substrate processing of performing super-resolution processing for detecting reference mark M required for the mounting operation on the images A and B captured of leading substrate S, and acquiring and memorizing in HDD 43 reference mark position Ma in image A. Further, with respect to subsequent substrates S that are the second and after substrates S, mounting device 11 performs subsequent-substrate processing in which super-resolution processing is performed on the partial processing region SR set based on the reference mark position Ma in images C and D that are images of subsequent substrate S. As a result, in the subsequent-substrate processing, mounting device 11 needs only to perform the super-resolution processing on the partial processing region SR, so as to efficiently perform the super-resolution processing. Further, since mounting device 11 sets the partial processing region SR based on the reference mark position Ma memorized during the leading-substrate processing, the processing region SR is set more appropriately. Also, since the generation of the high-resolution image takes time for processing because multiple captured images are used, the effect of reducing the processing time is remarkable by limiting processing to the partial processing region SR.

Further, in the leading-substrate processing, mounting device 11 generates a high-resolution image by super-resolution processing based on the positional deviation amount obtained by correlating images A and B and images A and B, detects reference mark M from the high-resolution image, acquires reference mark position Ma in image A, and memorizes reference mark position Ma in HDD 43. In the subsequent-substrate processing, mounting device 11 sets partial processing region SR in image C based on the positional deviation amount obtained by correlating image A with image C and reference mark position Ma stored in HDD 43, generates a high-resolution image based on the positional deviation amount obtained by correlating image A with image C with the processing region SR in images C and D, and detects reference mark M from the high-resolution image. As a result, mounting device 11 can set the partial processing region SR using simple processing based on image A used in the leading-substrate processing and image C used in the subsequent-substrate processing so as to perform the super-resolution processing.

Also, in the leading-substrate processing, mounting device 11 acquires the positional deviation amount of the respective images by the phase-limited correlation method using the image data of images A and B subjected to the Fourier transformation, and memorizes data Da of image A after the Fourier transformation in HDD 43. Further, in the subsequent-substrate processing, mounting device 11 uses the image data obtained by Fourier transforming image C and data Da memorized in HDD 43 when correlating the images A and C. As a result, mounting device 11 efficiently performs the correlation between images A and C in the subsequent-substrate processing by using the Fourier-transformed data Da memorized in HDD 43.

Further, mounting device 11 detects reference mark M on the upper surface of substrate S by super-resolution processing. Here, since reference mark M has also been miniaturized along with the miniaturization of substrate S and components in recent years, CPU 41 requires super-resolution processing for each substrate S in order to detect the mark. Therefore, the effect of efficiently performing the super-resolution processing becomes more remarkable.

Meanwhile, it goes without saying that the disclosure is not limited to the above-mentioned embodiment and various embodiments may be applied within the technical scope of the disclosure.

For example, in an embodiment described above, CPU 41 uses a multi-frame reconstruction type super-resolution processing for acquiring an image having a higher resolution from multiple images in the mark detection processing. However, CPU 41 may use other super-resolution processes for the mark detection processing. For example, CPU 41 may use a single-frame reconstruction type super-resolution processing for the mark detection processing. Single frame reconstruction type super-resolution processing is processing for acquiring an image with high resolution from one image, such as image A (or C). As single frame reconstruction type super-resolution processing, for example, there is a type in which a provisional high-resolution image is created from one image A (or C), a deteriorated image that mimics a deterioration process during imaging is created from the provisional high-resolution image, the error between the deteriorated image and the original image A (or C) is calculated, and image correction for the error is performed for the temporary high-resolution image, with processing being repeated to obtain a final high-resolution image. Also, CPU 41 may use learning-type super-resolution processing for the mark detection processing. As learning type super-resolution processing, for example, there is a type in which CPU 41 estimates and acquires an image with a high resolution based on a previously learned result in which an image having a resolution substantially equal to that of an image captured by mark camera 25 is used as teaching data. As learning type super-resolution processing, CPU 41 may also use a single-frame learning type super-resolution processing for estimating and acquiring a high-resolution image from one image A (or C) based on a learning result in advance. Alternatively, as learning type super-resolution processing, CPU 41 may use multi-frame learning type super-resolution processing for acquiring an image with high resolution from multiple images A and B (or C and D) based on a learning result in advance.

In an embodiment described above, data Da of image A after Fourier transformation is stored in HDD 43, but the configuration is not limited to this, and image A may be Fourier transformed each time the correlation with image C is performed. However, in order to efficiently process the data Da, it is desirable to memorize data Da in HDD 43.

In an embodiment described above, the processing region SR is set using images A and C that are the first images of the leading substrate S and the subsequent substrate S, but the configuration is not limited to this, and the processing region SR may be set using the images B and D which are the second images of the leading substrate S and the subsequent substrate S. In this case, in leading-substrate processing, the position of reference mark M in image B may be memorized, and the data of image B after Fourier transformation may be memorized.

In an embodiment described above, super-resolution processing is used as the image processing, but the configuration is not limited to this, and any processing may be used as long as the image processing is performed on an image obtained by imaging the substrate S. Further, the image processing is not limited to image processing for detecting reference mark M on the substrate S, a mark on the substrate S other than reference mark M or another detection target such as a two-dimensional code may be detected. Also, the image processing is not limited to image processing before mounting onto substrate S, and may be image processing before printing solder or the like onto substrate S, or image processing before inspection performed after mounting components on the substrate S. That is, in an embodiment described above, mounting device 11 is used as a substrate working device, but any device may be used as long as it performs a predetermined work on substrate S, such as a printing device that performs printing on substrate S, or an inspection device that performs inspection on substrate S.

In an embodiment described above, the high-resolution image is generated based on the two images, A and B (or images C and D), but the configuration is not limited to this, and the high-resolution image may be generated based on three or more images.

In a substrate working device of the present disclosure, the image processing may be super-resolution processing for generating a high-resolution image having a higher resolution than multiple images by using multiple images obtained by capturing images by relatively shifting the positions of the substrate and the imaging device. Since the generation of such a high-resolution image tends to increase the processing time because multiple images are used, the effect of reducing the processing time by limiting the processing time to a partial processing region becomes remarkable.

With a substrate working device of the present disclosure, the image processing device may be configured to, in the leading-substrate processing, generate the high-resolution image based on the position deviation amount between images obtained from the relationship between the multiple images using the multiple images including a first image and a second image as the leading image, detect the specified target object from the high-resolution image, acquire the region information in the first image, and memorize the region information on the memory device, and, in the subsequent-substrate processing, acquire the multiple images including a third image and a fourth image as the subsequent image, set the partial processing region in the third image based on a position deviation amount between the two images obtained from a correlation between the first and the third images, generate the high-resolution image based on a position deviation amount between the images obtained from a correlation between the processing regions specified among the multiple images, and detect the specified detection target from the high-resolution image. This makes it possible to appropriately set a partial processing region by using the first image used in the leading-substrate processing and the third image used in the subsequent-substrate processing.

In a substrate working device according to the present disclosure, the image processing device may be configured to, in the leading-substrate processing, correlate the multiple images using image data obtained by subjecting the multiple images including the first image and the second image to specified conversion processing, and memorize the image data of the first image subjected to the specified conversion processing in the memory device, and in the subsequent-substrate processing, when correlating the first image with the third image, use the image data obtained by subjecting the third image to the specified conversion processing and the image data of the first image subjected to the specified conversion processing that is memorized in the memory device. In this case, when the correlation between the first image and the third image is obtained in the subsequent-substrate processing, it is not necessary to perform predetermined conversion processing on the first image because the image data of the first image that has been subjected to the predetermined conversion processing memorized in the memory device is used, thus the first image is efficiently processed.

In a substrate working device of the present disclosure, the specified detection target may be a mark on an upper surface of the substrate. Here, along with the miniaturization of substrates and components in recent years, marks on the upper surface of the substrate have in cases become so small as to be difficult to detect from an image captured by an imaging device. In such a case, since the super-resolution processing is performed for each substrate to detect the mark, the effect of performing the image processing efficiently becomes more remarkable.

INDUSTRIAL APPLICABILITY

The present disclosure can be applied to a device for performing work on a substrate.

REFERENCE SIGNS LIST

10: mounting system;
11: mounting device;
12: substrate conveyance unit;
13: mounting unit;
14: component supply unit;
15: tape feeder;
16: tray feeder;
20: head moving section;
22: mounting head;
23: Z-axis motor;
24: suction nozzle;
25: mark camera;
30: component camera;
40: control device;
41: CPU;
42: ROM;
43: HDD;
44: RAM;
45: input-output interface (input-output I/F);
46: bus;
50: management computer (management PC);
52: input device;
54: display;
M: reference mark;
Mrc: coarse position;
S: substrate;
SR: processing region

The invention claimed is:

1. A substrate working device comprising:
an imaging device configured to image a substrate;
a memory device configured to memorize various information; and
an image processing device configured to perform, for a leading substrate among multiple of the substrates that are a target for specified work, leading-substrate processing of performing imaging processing for detecting a specified detection target required for the specified work with respect to a leading image obtained by imaging the leading substrate using the imaging device, acquiring region information related to a region in the leading image in which the detection target was detected, and memorizing the region information in the memory device, and, for subsequent substrates among the multiple of the substrates that are the target for specified work except for the leading substrate, subsequent-substrate processing of setting a partial processing region in a subsequent image of the subsequent substrate captured by the imaging device based on a position deviation amount between the image of the leading substrate and the subsequent image of the subsequent substrate and the region information of the leading substrate memorized in the memory device, acquiring a high-resolution image of the set partial processing region of the subsequent substrate, and detecting a specified detection target in the high-resolution image of the set partial processing region of the subsequent substrate.

2. The substrate working device according to claim 1, wherein
the image processing is super-resolution processing for generating a high-resolution image having a higher resolution than each of multiple images by using the multiple images obtained by capturing images by relatively shifting the positions of the substrate and the imaging device.

3. The substrate working device according to claim 2, wherein
the image processing device is configured to, in the leading-substrate processing, generate the high-resolution image based on the position deviation amount between images obtained from the relationship between the multiple images using the multiple images including a first image and a second image as the leading image, detect the specified target object from the high-resolution image, acquire the region information in the first image, and memorize the region information on the memory device, and, in the subsequent-substrate processing, acquire the multiple images including a third image and a fourth image as the subsequent image, set the partial processing region in the third image based on the position deviation amount between the two images obtained from a correlation between the first and the third images.

4. The substrate working device according to claim 3, wherein
the image processing device is configured to, in the leading-substrate processing, correlate the multiple images using image data obtained by subjecting the multiple images including the first image and the second image to specified conversion processing, and memorize the image data of the first image subjected to the specified conversion processing in the memory device, and in the subsequent-substrate processing, when correlating the first image with the third image, use the image data obtained by subjecting the third image to the specified conversion processing and the image data of the first image subjected to the specified conversion processing that is memorized in the memory device.

5. The substrate working device according to claim 1, wherein
the specified detection target is a mark on an upper surface of the substrate.

6. An image processing method for processing an image of a substrate on which specified work is to be performed, the image processing method comprising:
(a) a first image processing step for detecting a specified detection target required for the specified work in a leading image that is an image of a leading substrate among the multiple substrates that are the target for the specified work;

(b) an acquiring step for acquiring region information related to a region inside the leading image in which the detection target was detected in the image processing step (a);
(c) a setting step for setting a partial processing region based on a position deviation amount between the image of the leading substrate and the subsequent image of the subsequent substrate and the region information acquired in the acquiring step (b) for a subsequent image that is an image of a subsequent substrate that is a substrate other than the leading substrate among the multiple substrates that are the target for the specified work; and
(d) acquiring a high-resolution image of the set partial processing region of the subsequent substrate set in the setting step (c), and detecting a specified detection target in the high-resolution image of the set partial processing region of the subsequent substrate.

* * * * *